(12) United States Patent
Zhang et al.

(10) Patent No.: US 11,322,214 B1
(45) Date of Patent: May 3, 2022

(54) GAUSSIAN MODELING FOR SOFT-READ THRESHOLD ESTIMATION IN NON-VOLATILE MEMORY DEVICES

(71) Applicant: SK hynix Inc., Icheon-si (KR)

(72) Inventors: Fan Zhang, Fremont, CA (US); Aman Bhatia, San Jose, CA (US); Haobo Wang, San Jose, CA (US); Meysam Asadi, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/147,770

(22) Filed: Jan. 13, 2021

(51) Int. Cl.
| | |
|---|---|
| *G11C 16/06* | (2006.01) |
| *G11C 16/34* | (2006.01) |
| *G11C 16/30* | (2006.01) |
| *G11C 16/08* | (2006.01) |
| *G11C 16/26* | (2006.01) |
| *G11C 16/10* | (2006.01) |

(52) U.S. Cl.
CPC .......... *G11C 16/3459* (2013.01); *G11C 16/08* (2013.01); *G11C 16/10* (2013.01); *G11C 16/26* (2013.01); *G11C 16/30* (2013.01)

(58) Field of Classification Search
CPC .. G11C 16/3459; G11C 16/08; G11C 16/3454
See application file for complete search history.

(56) References Cited

U.S. PATENT DOCUMENTS

| | | | |
|---|---|---|---|
| 8,289,781 B2 | 10/2012 | Litsyn et al. | |
| 9,489,257 B2 | 11/2016 | Ish-Shalom et al. | |
| 2010/0091535 A1* | 4/2010 | Sommer | G11C 16/20 365/45 |
| 2013/0031431 A1* | 1/2013 | Sharon | G11C 16/3481 714/719 |

\* cited by examiner

*Primary Examiner* — Uyen Smet
(74) *Attorney, Agent, or Firm* — Perkins Coie LLP

(57) ABSTRACT

Devices, systems and methods for improving the performance of a memory device are described. An example method includes obtaining a plurality of cell counts for each of a plurality of read voltages applied to the memory device, generating, based on the plurality of cell counts, a set of Gaussian models for a plurality of PV states corresponding to the plurality of read voltages, each of the set of Gaussian models comprising a mean parameter and a standard deviation parameter, determining, based on the set of Gaussian models, the mean parameter and the standard deviation parameter for each of the plurality of PV states, determining, based on the mean parameter and the standard deviation parameter for each of the plurality of PV states, a plurality of updated read voltages, and applying the plurality of updated read voltages to the memory device to retrieve information from the memory device.

20 Claims, 11 Drawing Sheets

$$\begin{pmatrix} m3 \\ m4 \\ m7 \\ m6 \end{pmatrix} \rightarrow \begin{pmatrix} \dfrac{a5\,vt2 - a1\,vt2p}{a1 - a5} + \dfrac{a6\,vt3 - a2\,vt3p}{a2 - a6} + \dfrac{a7\,vt5 - a3\,vt5p}{a3 - a7} \\ \dfrac{a8\,vt6 - a4\,vt6p}{a4 - a8} + \dfrac{-vt2 + vt2p}{a1 - a5} + \dfrac{-vt3 + vt3p}{a2 - a6} \\ \dfrac{-vt5 + vt5p}{a3 - a7} + \dfrac{-vt6 + vt6p}{a4 - a8} \end{pmatrix}$$

*FIG. 11A*

$$x \rightarrow \dfrac{1}{a1^2 - a2^2}\left( -m2\,a1^2 + m1\,a2^2 + \sqrt{a1^2\,a2^2\left((m1-m2)^2 - 2(a1^2 - a2^2)\,\mathrm{Log}\left(\dfrac{a2}{a1}\right)\right)}\right)$$

$$x \rightarrow \dfrac{1}{a1^2 - a2^2}\left( -m2\,a1^2 + m1\,a2^2 - \sqrt{a1^2\,a2^2\left((m1-m2)^2 - 2(a1^2 - a2^2)\,\mathrm{Log}\left(\dfrac{a2}{a1}\right)\right)}\right)$$

GAUSSIAN MODELING FOR SOFT-READ THRESHOLD ESTIMATION IN NON-VOLATILE MEMORY DEVICES

TECHNICAL FIELD

This patent document generally relates to memory devices, and more specifically, to robust and reliable access in memory devices.

BACKGROUND

Data integrity is important for data storage devices and data transmission. In solid state memory storage (such as NAND flash) devices, information is stored in a cell by different charge levels in a cell. During the write and read process, noise is introduced by program disturb and inter-cell interference charge leakage that causes the voltage distribution and level to drop over time. Accounting for the voltage distribution when determining the read voltage thresholds increases the longevity of memory devices.

SUMMARY

Embodiments of the disclosed technology relate to using Gaussian modeling to estimate soft-read thresholds in the operation of memory devices, which improves performance of the memory device. These and other features and benefits are achieved at least in-part by using a Gaussian model that assumes distinct means and standard deviations for each cell voltage of the cell voltage level distribution of the memory device.

In an example aspect, a method for improving performance of a memory device is described. The method includes obtaining a first plurality of cell counts for each of a plurality of read voltages applied to the memory device, wherein each of the plurality of read voltages corresponds to a program verify (PV) state, wherein a representation of the PV state comprises a least significant bit (LSB), a most significant bit (MSB), and a central significant bit (CSB), and wherein each of the first plurality of cell counts represents a number of cells having a cell voltage value that is within a voltage band corresponding to the read voltage for the associated PV state applied thereto, generating, based on the first plurality of cell counts, a first set of Gaussian models for a plurality of PV states corresponding to the plurality of read voltages, each of the first set of Gaussian models comprising a mean parameter and a standard deviation parameter, wherein the mean parameter and the standard deviation parameter for a first Gaussian model of the first set of Gaussian models is different from the mean parameter and the standard deviation parameter for a second Gaussian model of the first set of Gaussian models, determining, based on the first set of Gaussian models, the mean parameter and the standard deviation parameter for each of the plurality of PV states, determining, based on the mean parameter and the standard deviation parameter for each of the plurality of PV states, a plurality of updated read voltages, and applying the plurality of updated read voltages to the memory device to retrieve information from the memory device.

In yet another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIGS. 11A and 11B illustrate examples of solutions for the means and standard deviations for cell voltage level distributions.

DETAILED DESCRIPTION

Semiconductor memory devices may be volatile or non-volatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels and distributions of read voltages for discriminating the data states must be adjusted over the lifetime of the memory device to have optimal values during read operations and/or read attempts.

FIGS. 1-6 overview a non-volatile memory system (e.g., a flash-based memory, NAND flash) in which embodiments of the disclosed technology may be implemented.

Figure 1:
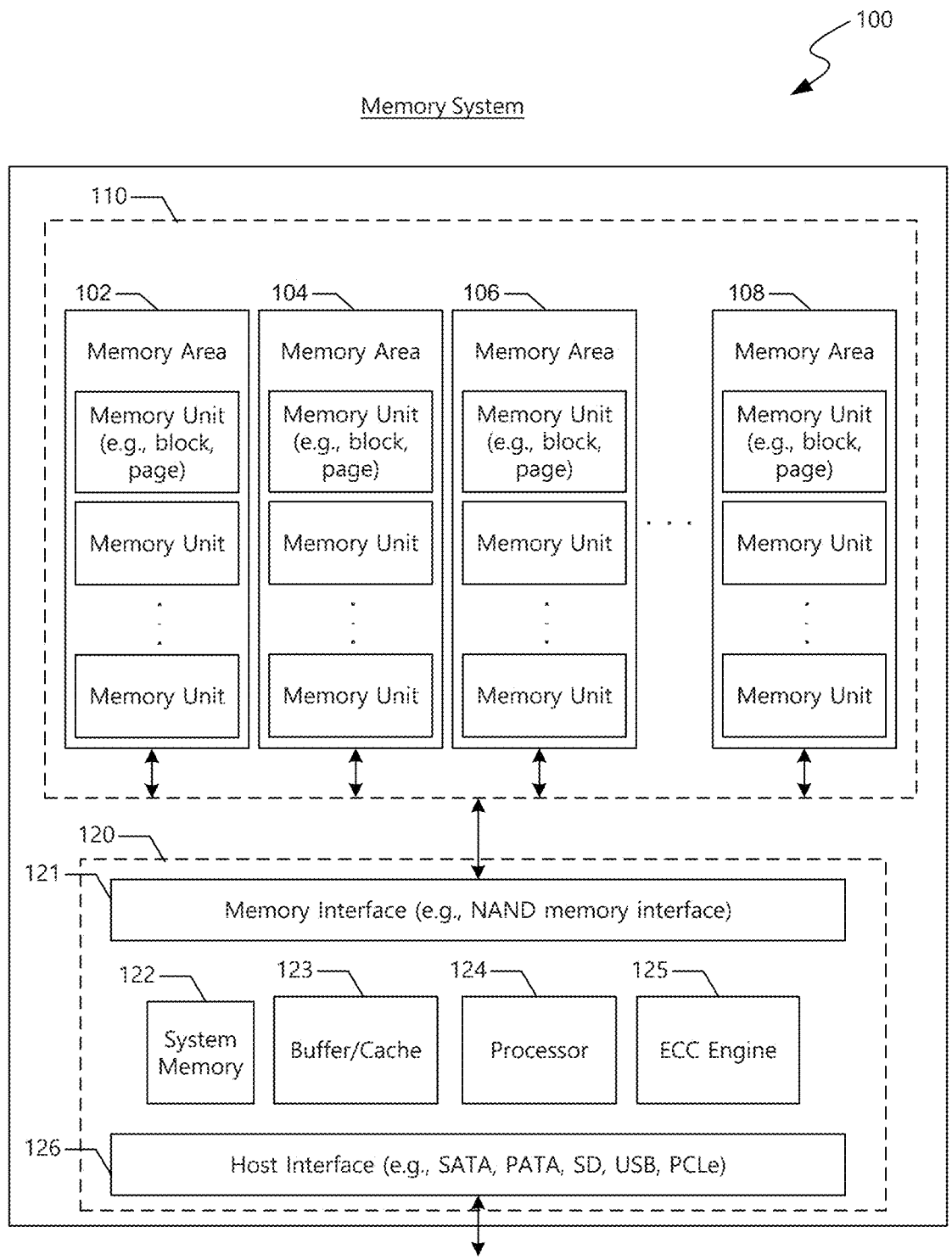
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
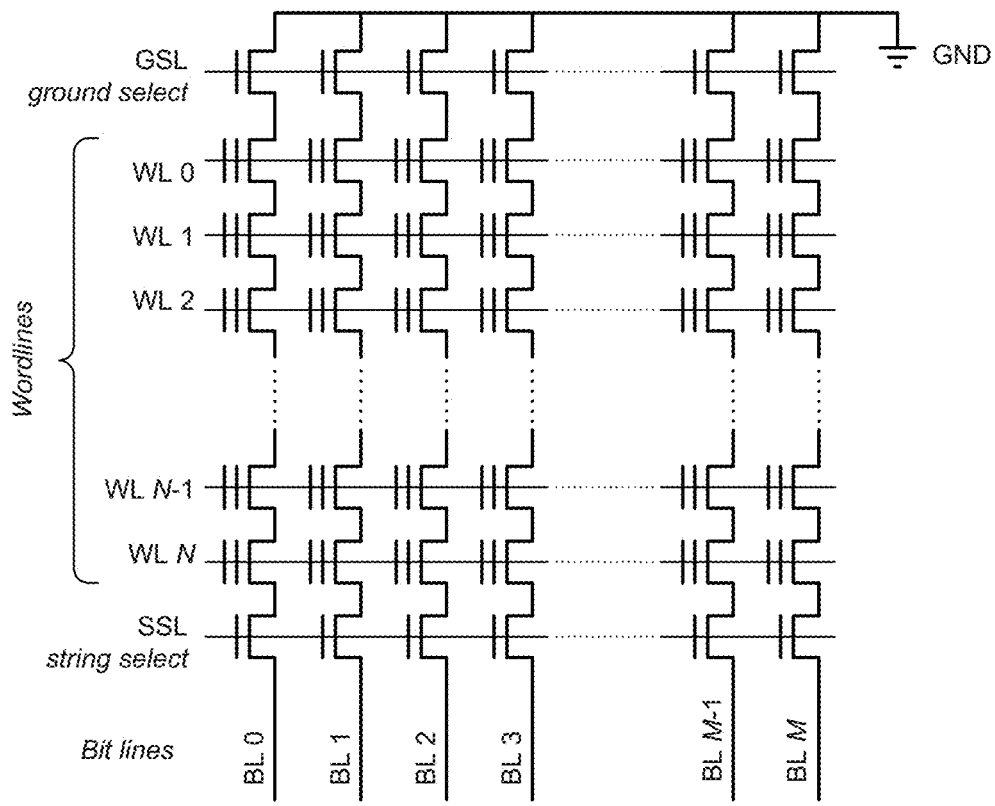
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
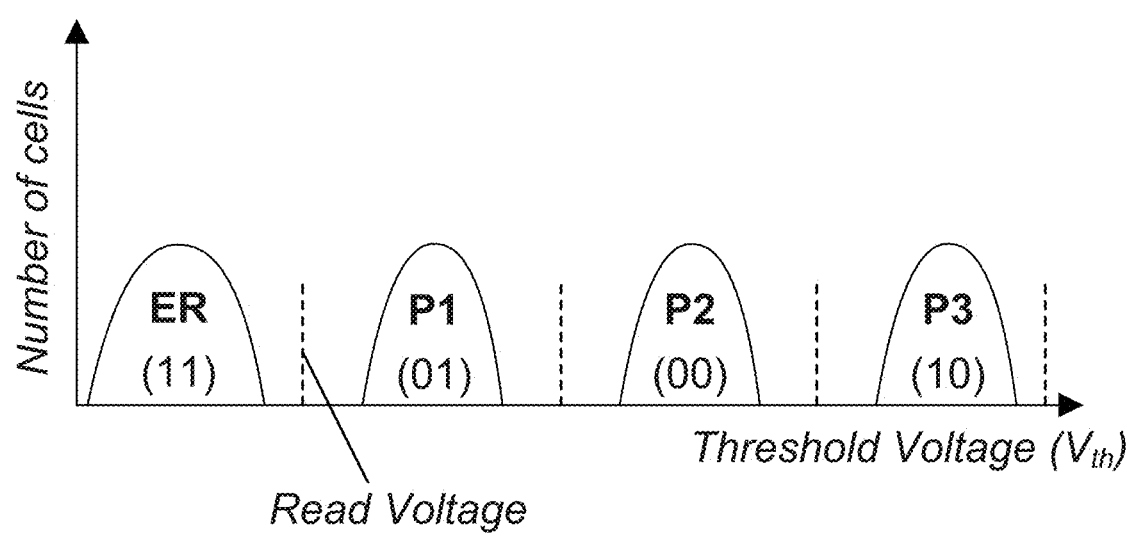
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
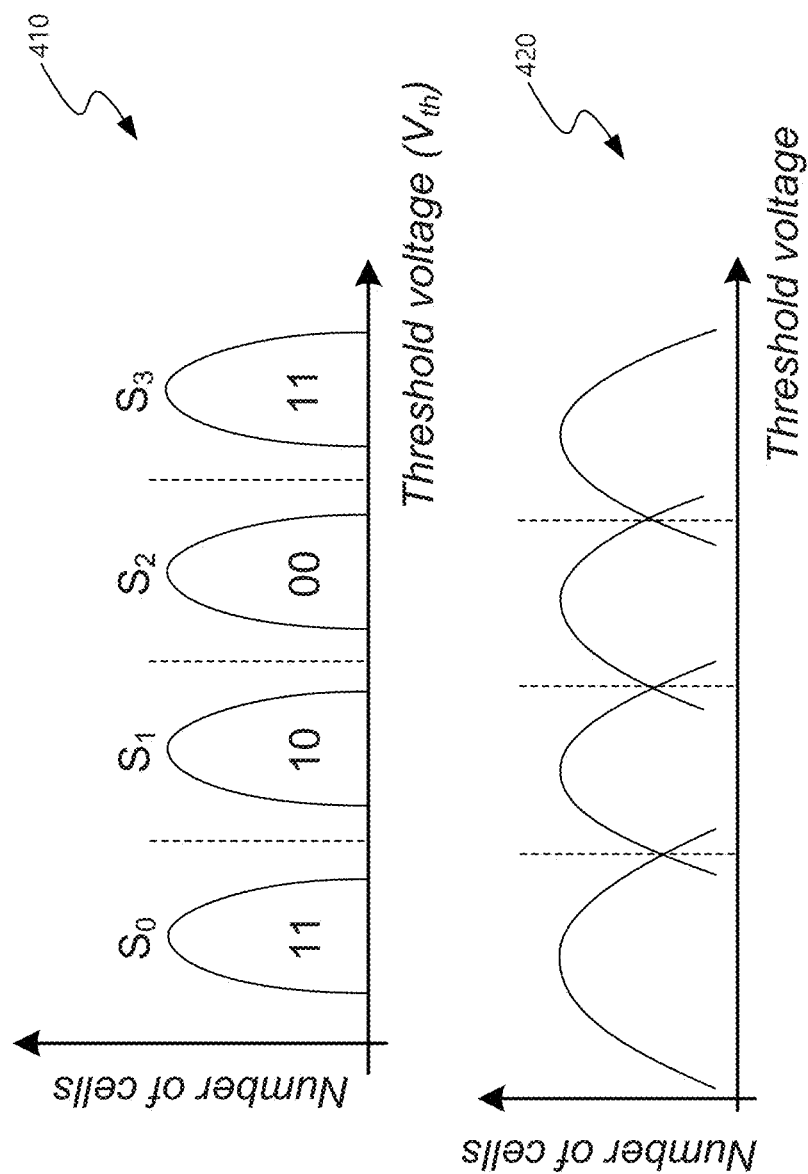
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
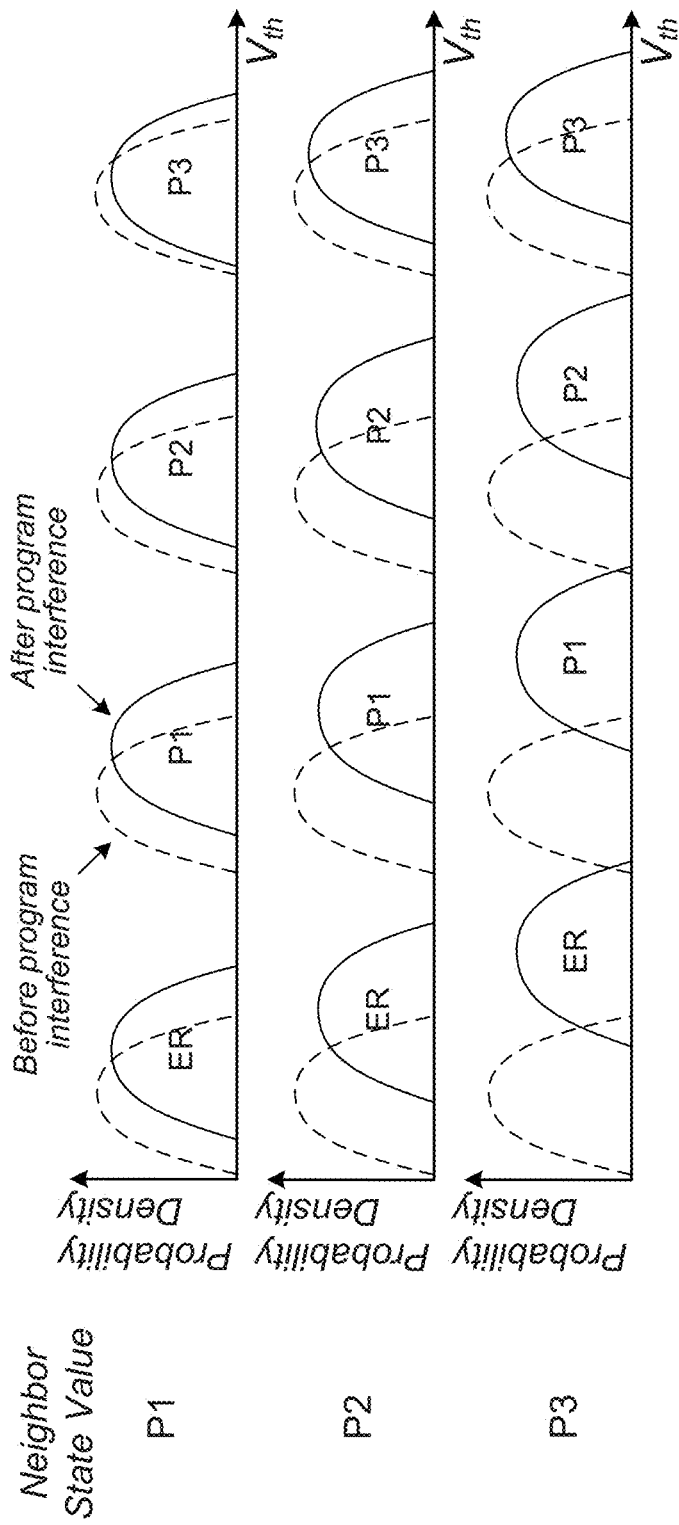
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
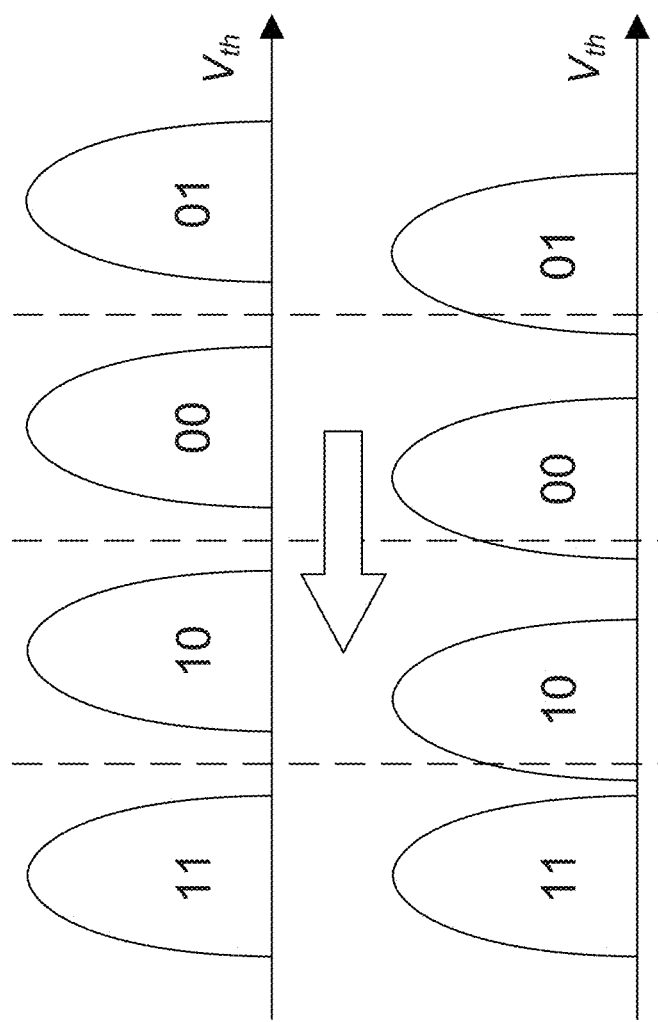
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND flash memory devices (e.g., as described in FIGS. 1-6), after a read command is received, a sequence of data recovery steps will be executed with the aim of retrieving the noise-free data from the NAND flash. A first attempt is referred to as a history-read, which uses the voltage (Vt) threshold that was used in a previous successful read. A previous successful read is one in which the decoder succeeded in recovering the noise-free data from the NAND flash. In typical implementations, the history-read is maintained separately per physical block and will be updated if decoding fails and a different Vt is used in subsequent steps of the data recovery operation that results in a decoder success.

However, if the history-read fails, then a history-read retry (HRR) operation will be performed. The HRR operation includes a series of pre-determined Vt thresholds that remain the same across time, and do not change as a function of NAND condition or physical location of the data. Typically, there are 5 to 10 HRR operations (or read attempts) performed before moving to the next step in the data recovery operation.

If all the predetermined HRR read attempts fail, the data recovery operation will perform an eBoost procedure, which implements soft-read and soft-decoding operations in an effort to retrieve the optimum value of the read voltage. That is, the eBoost procedure will perform multiple reads to find the best center Vt for the soft-read operation. In some embodiments, the eBoost procedure is based on a Gaussian modeling (GM) implementation.

Typical implementations of the GM implementation assume all program verify (PV) states are Gaussian distributions with known (or constant) variances and unknown and distinct means. Embodiments of the disclosed technology include methods, systems and devices that implement a Gaussian modeling implementation that employs Gaussian distributions for the PV states that have unknown and distinct means and variances (or standard deviations), which advantageously improve performance of the memory device and increases its longevity.

Figure 7:
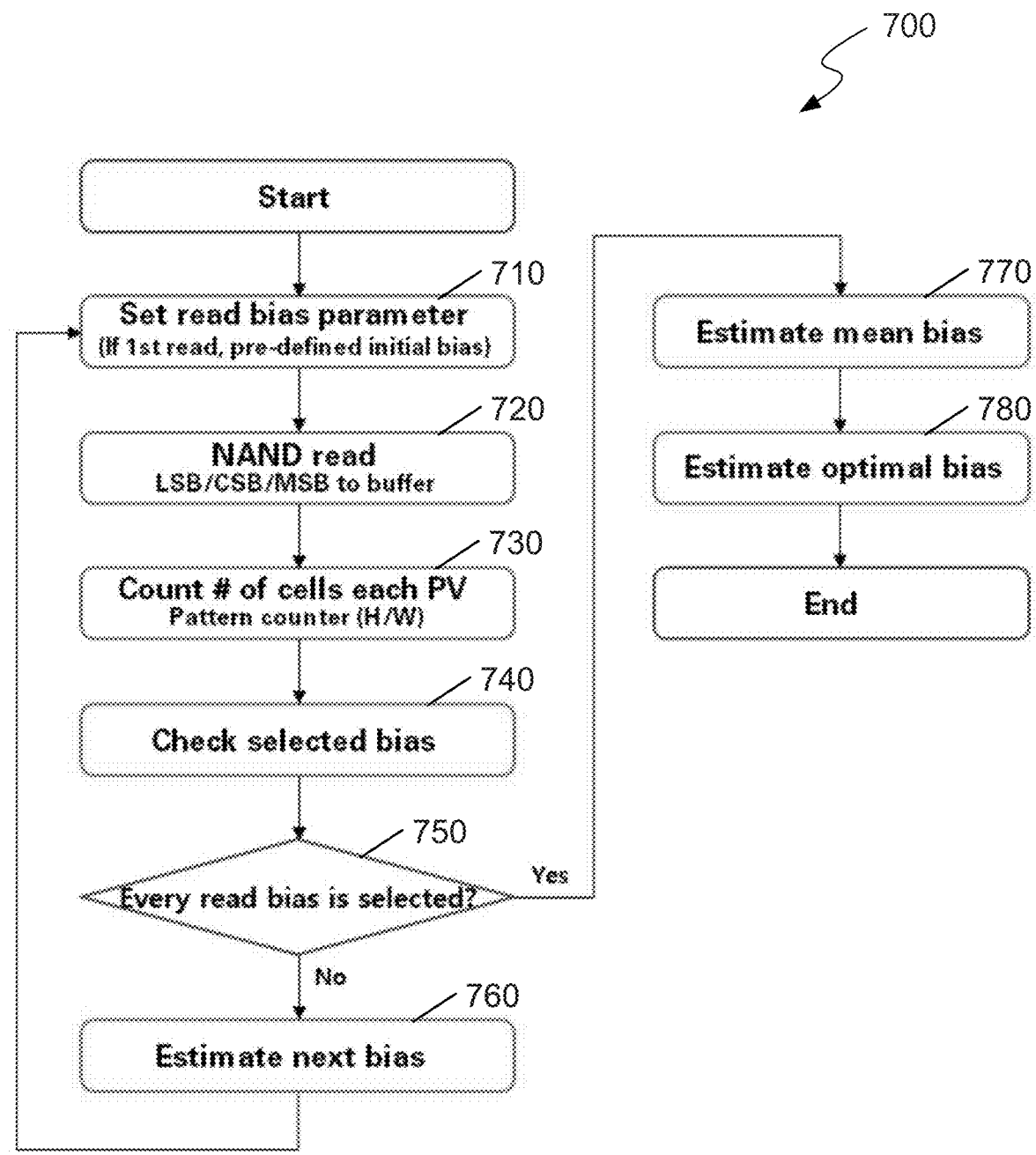
FIG. 7 illustrates a set of example operations for a Gaussian modeling implementation.

FIG. 7 illustrates a set of example operations for a Gaussian modeling implementation 700. The operations assume the PV states are modeled using Gaussian distributions with the same constant variance and unknown and distinct means. As illustrated therein, the GM implementation begins at operation 710 by setting the bias parameter for the read attempts. For the first read attempt, a pre-defined initial bias may be used, and for subsequent read attempts the next read bias parameter is set.

The GM implementation 700 continue at operation 720 by performing a NAND read operation, which reads all least significant bit (LSB) pages, central significant bit (CSB) pages and most significant bit (MSB) pages on the same word line (WL), and stores them to a buffer. The LSB, CSB and MSB pages are used to determine patterns counts, in operation 730, therein determining the number of cells in each Vt interval in between adjacent read thresholds.

In operation 740, the selected bias is checked based on the pattern counts, and in operation 750, the GM implementation checks whether every read bias has been selected. If every read bias has not been selected ("No" path from operation 750), the next read bias is estimated (operation 760) and the GM implementation returns to operation 710, where this next read bias parameter is set. However, if all the read bias values have been selected ("Yes" path from operation 750), the mean bias value is then estimated in operation 770. In an example, the mean bias value (which is unknown and distinct for each PV state) can be determined by inverting the Q function. In operation 780, the optimal read bias is determined, and this optimal read bias value can be used to perform subsequent NAND read operations.

The GM implementation illustrated in FIG. 7 assumes that the mean for each of the Gaussian distributions that models a corresponding PV state are unknown and distinct, but the variance (equivalently, the standard deviation) are constant and identical for the Gaussian distributions. However, empirical data (e.g., as illustrated in FIGS. 8A and 8B) suggests that this is not always the case.

Figure 8A:
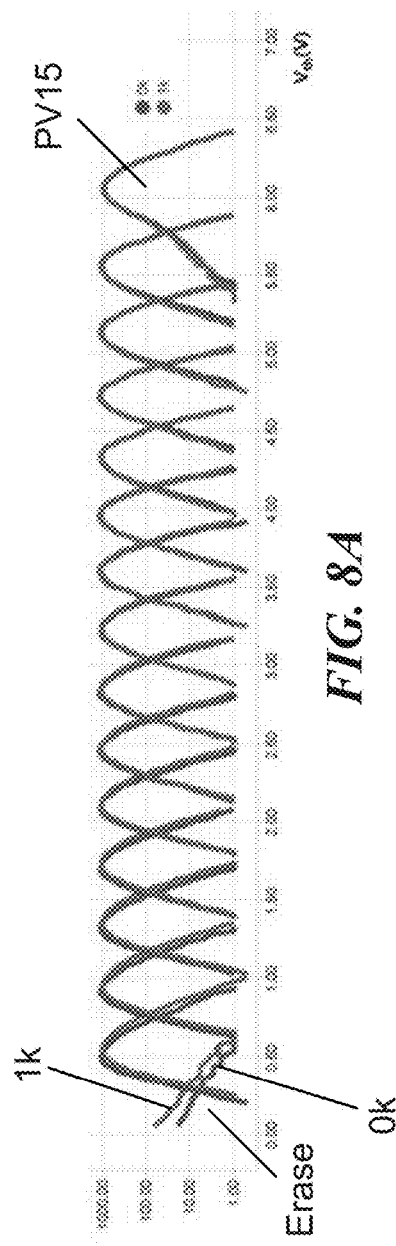
FIG. 8A illustrates example data collected for a cell voltage level distribution from a quadruple level cell (QLC) at a 0K program/erase count (PEC) and a 1K PEC.

FIG. 8A illustrates example data collected for a cell voltage level distribution from a quadruple level cell (QLC) at a 0K program-erase count (PEC) and a 1K PEC. As shown therein, the distributions for the Erase and PV15 states do not follow the Gaussian distribution. FIG. 8B illustrates example data collected for a cell voltage level distribution from a high free block count (FBC) page at a 5K PEC and 30D retention. As shown therein, PV0 and PV1 have asymmetric left and right tails, respectively, and PV7 has larger left tail. Furthermore, a certain number of hard errors are also observed.

Figure 8B:
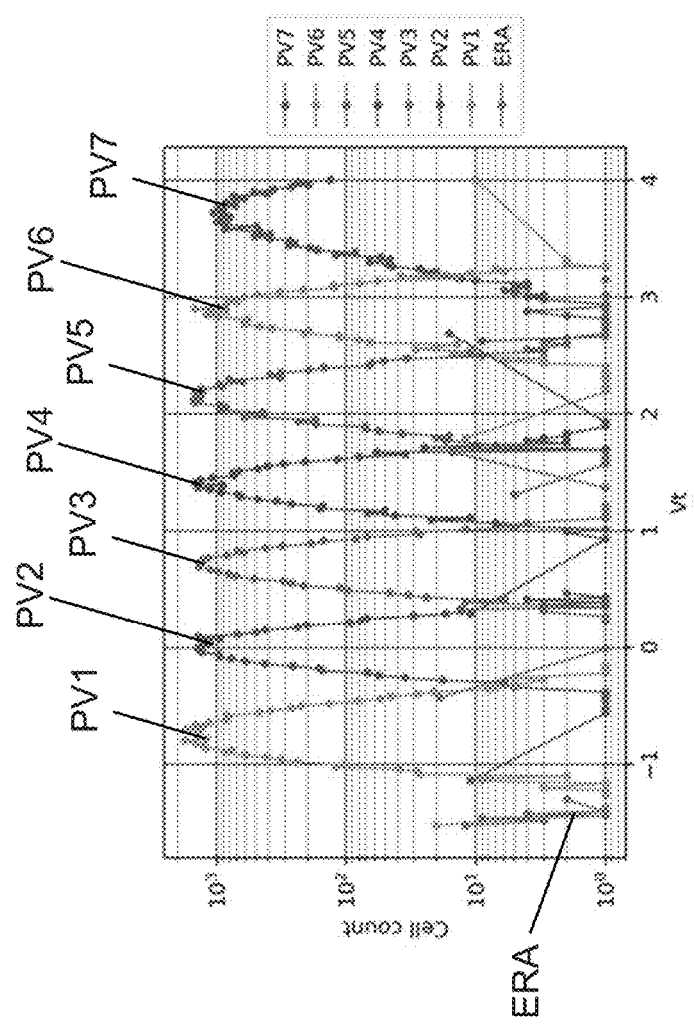
FIG. 8B illustrates example data collected for a cell voltage level distribution from a high free block count (FBC) page at a 5K PEC.

In the examples illustrated in FIGS. 8A and 8B, the typical Gaussian modeling implementation (e.g., as incorporated in the operations of FIG. 7) will result in estimation errors because the underlying PV distributions are not Gaussian with constant variances.

Embodiments of the disclosed technology utilize Gaussian modeling implementations and procedures that allow each PV state to have a distinct unknown mean and variance, which will better model the underlying PV distributions (e.g., as shown in FIGS. 8A and 8B). An example of this improved Gaussian modeling procedure is illustrated in FIG. 9.

Figure 9:
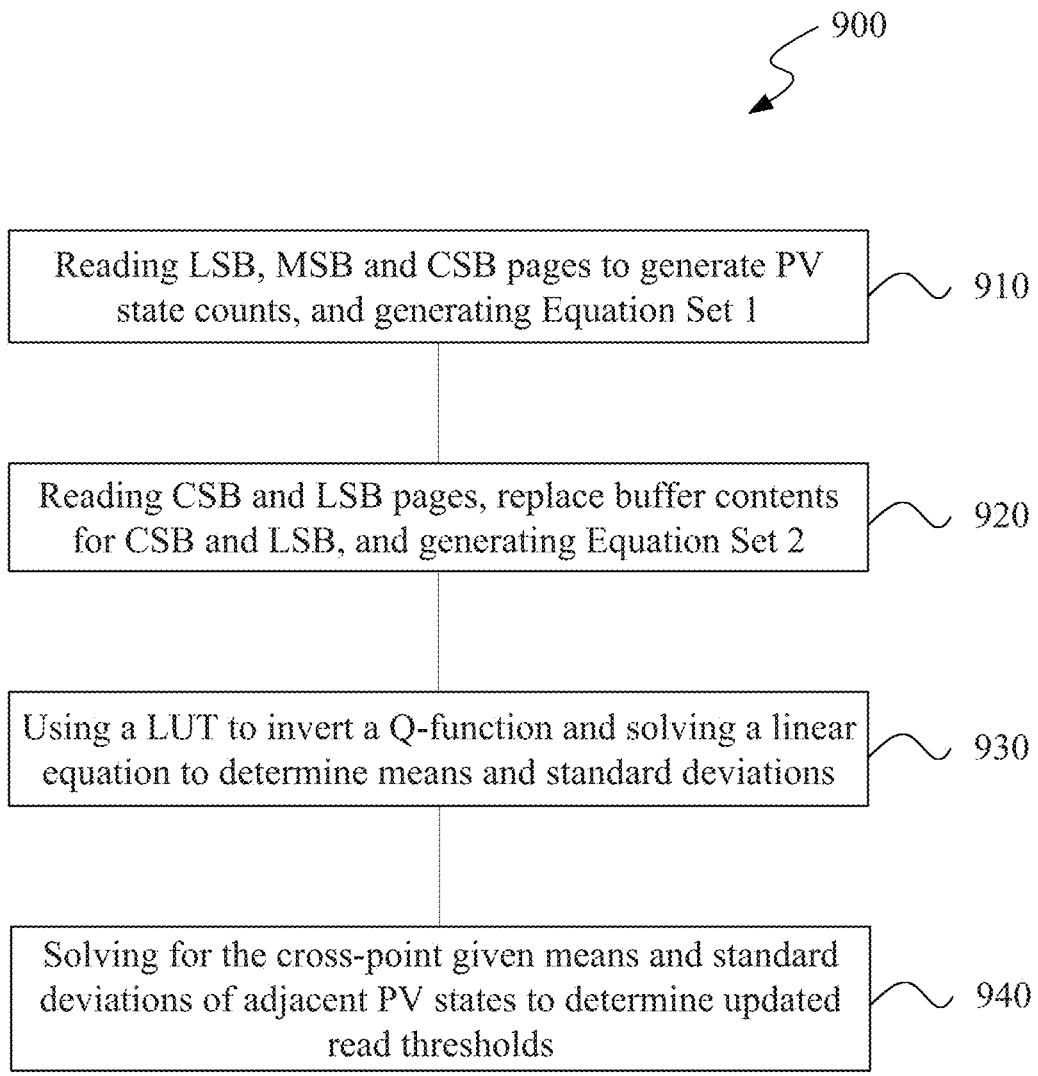
FIG. 9 illustrates a set of example operations for an improved Gaussian modeling implementation.

FIG. 9 illustrates a set of example operations for an improved Gaussian modeling implementation. The operations, which can be used for obtaining optimum read values, assume the PV states are modeled using Gaussian distributions with distinct unknown means and distinct unknown variances. Without loss of generality, the example illustrated in FIGS. 9-11 uses an LSB page to describe the improved Gaussian modeling implementation. A similar procedure can be implemented for CSB pages and MSB pages.

Figure 10A:
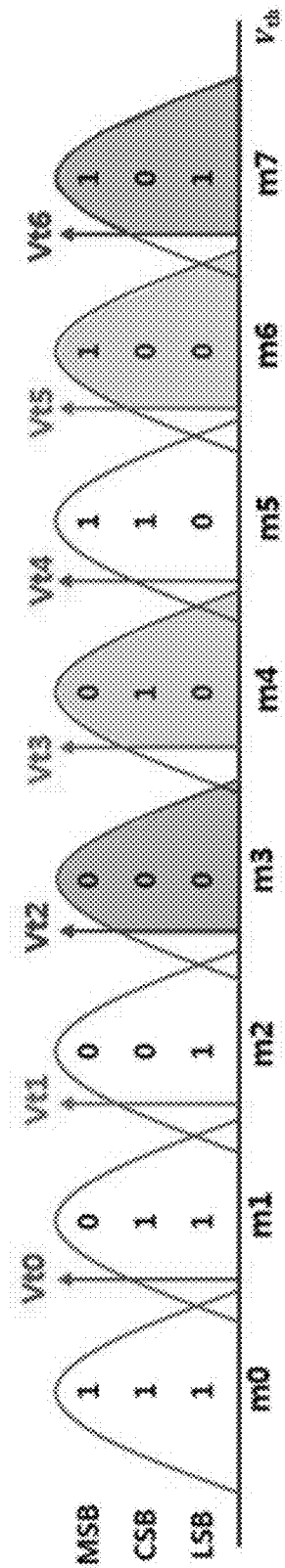
FIGS. 10A and 10B illustrate examples of the cell voltage level distributions used to generate the program verify (PV) state counts.

The GM implementation 900 begin with operation 910 that reads the LSB, MSB and CSB pages, as illustrated in FIG. 10A, to generate the PV state counts. In the example shown in FIG. 10A, the LSB pages correspond to Vt2 and Vt6, the CSB pages correspond to Vt1, Vt3 and Vt5, and the MSB pages correspond to Vt0 and Vt4. The LSB, CSB and MSB page reads are stored in a buffer. The PV state counts are used to generate a first Gaussian model equation set, which is represented as:

$$p_i = Q\left(\frac{Vt_{i-1} - m_i}{\sigma_i}\right), i = 7, 6, 4, 3.$$

In the first Gaussian model equation set, $m_i$ and $\sigma_i$ are the i-th mean and i-th standard deviation of the $Vt_{i-1}$ distribution, respectively, and $Q(\bullet)$ is the Q-function that is given by:

$$Q(x) = \frac{1}{\sqrt{2\pi}} \int_x^\infty \exp\left(-\frac{u^2}{2}\right) du.$$

Figure 10B:
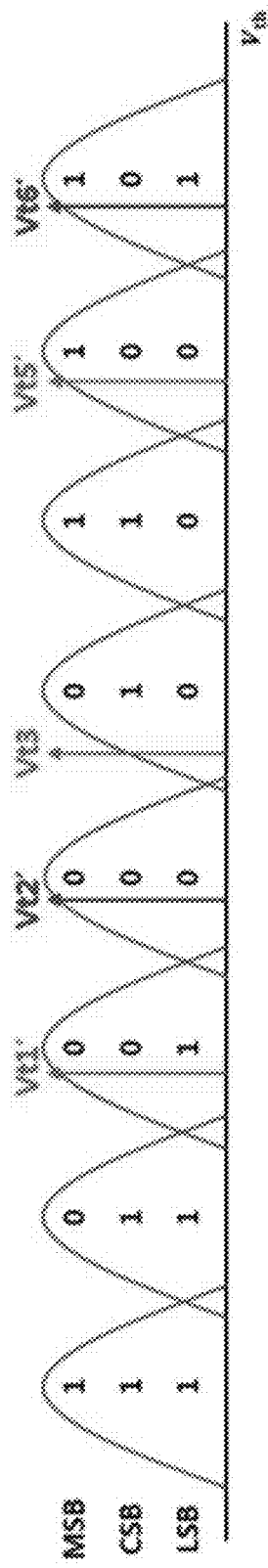

In operation 920 of the GM implementation 900, two more reads are performed as shown in FIG. 10B. In particular, the CSB pages (corresponding to Vt1, Vt3 and Vt5) and the LSB pages (corresponding to Vt2 and Vt6) are read, and the buffer contents for the CSB and LSB pages from the read in operation 910 are replaced by the CSB and LSB pages read in operation 920. The data from the MSB pages (corresponding to Vt0 and Vt4) in the buffer remain unchanged. The PV states counts that are determined using the new buffer contents are used to generate a second Gaussian model equation set (similar to first Gaussian model equation set, but based on the new buffer contents).

The GM implementation 900 continues at operation 930, wherein the Q-function is inverted in the first and second Gaussian model equation sets, and the resulting linear equation set is solved to determine the mean ($m_i$) and standard deviation ($\sigma_i$) for PV states for i=3, 4, 6 and 7, as shown in FIG. 11A. In some embodiments, the Q-function is inverted using a look-up table (LUT). In an example, the LUT can store values that correspond to the inverse of the Q-function at one or more predetermined precisions. In another example, the LUT can store values that correspond to the complementary error function (typically denoted "erfc") at one or more predetermined precisions.

In operation 940, the cross-point is solved for to determine the means and variances of adjacent PV states to derive the optimal read thresholds Vt2 and Vt6. If $|\sigma_1 - \sigma_2| < \Delta$ then the cross-point is equal to $(m_1+m_2)/2$, where $\Delta$ is a small quantity. Otherwise, there are two cross-points, as shown in FIG. 11B, and the cross-point in between $m_1$ and $m_2$ is selected as the optimal read threshold.

In some embodiments, the improved Gaussian modeling implementation can be used to determine the optimal read thresholds between each set of PV states based on the assumption that each of the underlying distributions have distinct and unknown means and variances.

In some embodiments, only the first and last Vt distributions have underlying Gaussian distributions that have different variances. In this scenario, the improved Gaussian modeling implementation (e.g., illustrated in FIG. 9) can be used to determine the optimal read thresholds between two adjacent PV states as long as one of the PV states is either the first Vt distribution or the last Vt distribution, i.e., the MSB and LSB pages. The simpler Gaussian modeling implementation (e.g., illustrated in FIG. 7) can be used to determine the other optimal read thresholds, i.e., the CSB pages. This approach can be used to reduce the complexity of the implementation.

Figure 12:
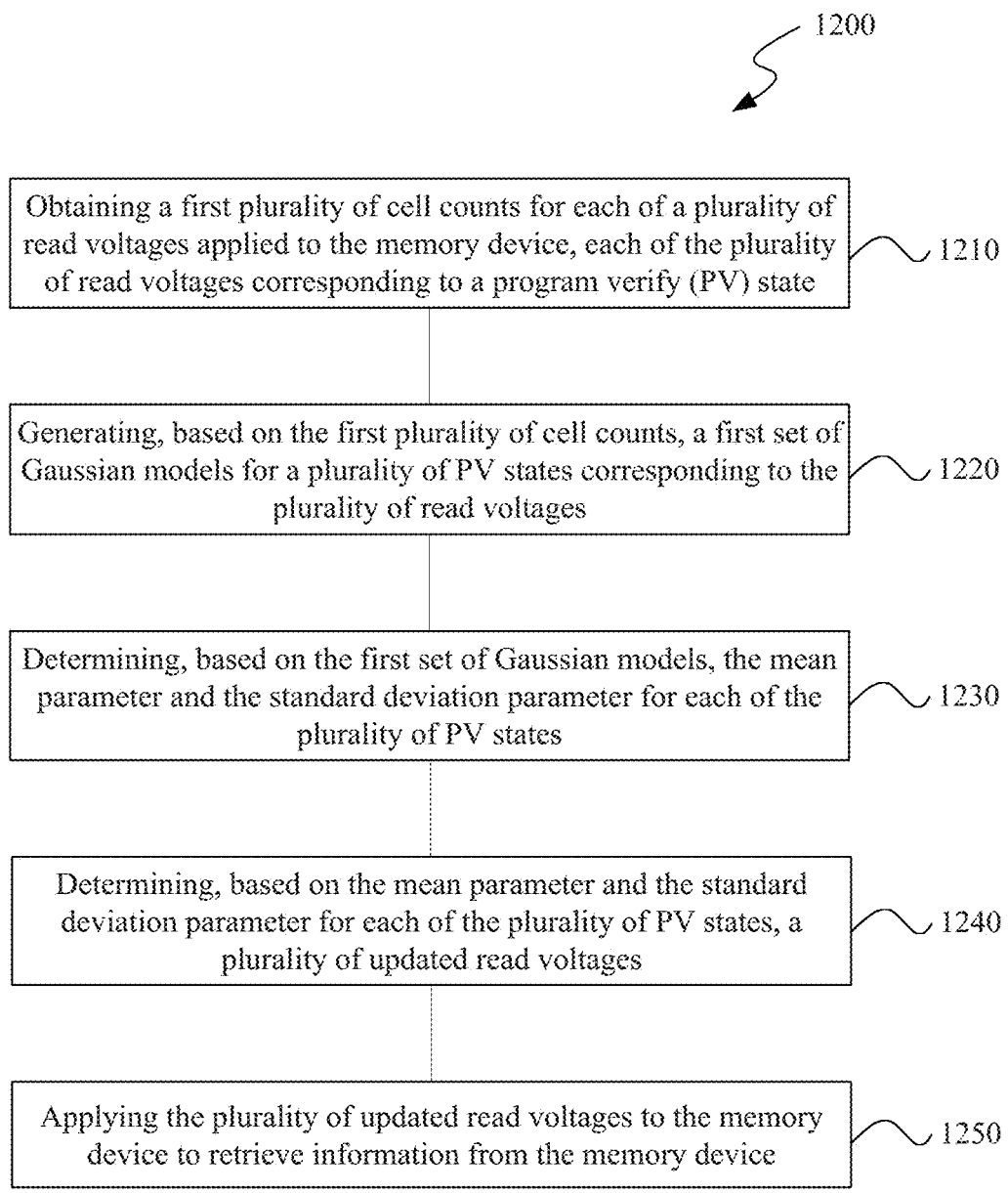
FIG. 12 illustrates a flowchart of an example method for improving performance of a memory device.

FIG. 12 illustrates a flowchart of a method 1200 for improving the performance of a memory device. The method 1200 includes, at operation 1210, obtaining a first plurality of cell counts for each of a plurality of read voltages applied to the memory device, wherein each of the plurality of read voltages corresponds to a program verify (PV) state, wherein a representation of the PV state comprises a least significant bit (LSB), a most significant bit (MSB), and a central significant bit (CSB), and wherein each of the first plurality of cell counts represents a number of cells having a cell voltage value that is within a voltage band corresponding to the read voltage for the associated PV state applied thereto.

The method 1200 includes, at operation 1220, generating, based on the first plurality of cell counts, a first set of Gaussian models for a plurality of PV states corresponding to the plurality of read voltages, each of the first set of Gaussian models comprising a mean parameter and a standard deviation parameter, wherein the mean parameter and the standard deviation parameter for a first Gaussian model of the first set of Gaussian models is different from the mean parameter and the standard deviation parameter for a second Gaussian model of the first set of Gaussian models.

The method 1200 includes, at operation 1230, determining, based on the first set of Gaussian models, the mean parameter and the standard deviation parameter for each of the plurality of PV states.

The method 1200 includes, at operation 1240, determining, based on the mean parameter and the standard deviation parameter for each of the plurality of PV states, a plurality of updated read voltages.

The method 1200 includes, at operation 1250, applying the plurality of updated read voltages to the memory device to retrieve information from the memory device.

In some embodiments, the method 1200 further includes the operations of obtaining a second plurality of cell counts for each of a subset of the plurality of read voltages applied to the memory device, the subset of the plurality of read voltages corresponding to PV states comprising at least two of the LSB, the MSB, and the CSB, and generating, based on the second plurality of cell counts, a second set of Gaussian models for the plurality of PV states, wherein the mean parameter and the standard deviation parameter for each of the plurality of PV states is further based on the second set of Gaussian models.

In some embodiments, the first plurality of cell counts and the second plurality of counts are obtained from a same word line (WL).

In some embodiments, determining the mean parameter and the standard deviation parameter for each of the plurality of PV states comprises inverting a Q-function.

In some embodiments, the Q-function of an argument (x) is defined as:

$$Q(x) = \frac{1}{\sqrt{2\pi}} \int_x^\infty \exp\left(-\frac{u^2}{2}\right) du.$$

In some embodiments, inverting the Q-function is based on a look-up table.

In some embodiments, determining the mean parameter and the standard deviation parameter for each of the plurality of PV states further comprises solving a set of linear equations.

In some embodiments, determining an updated read voltage of the plurality of updated read voltages for adjacent PV states is based on an absolute value of a difference between the standard deviations for the adjacent PV states.

In some embodiments, the memory device comprises a non-volatile memory comprising at least one quadruple level cell (QLC).

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving performance of a memory device, comprising:
    obtaining a first plurality of cell counts for each of a plurality of read voltages applied to the memory device, wherein each of the plurality of read voltages corresponds to a program verify (PV) state, wherein a representation of the PV state comprises a least significant bit (LSB), a most significant bit (MSB), and a central significant bit (CSB), and wherein each of the first plurality of cell counts represents a number of cells having a cell voltage value that is within a voltage band corresponding to the read voltage for the associated PV state applied thereto;
    generating, based on the first plurality of cell counts, a first set of Gaussian models for a plurality of PV states corresponding to the plurality of read voltages, each of the first set of Gaussian models comprising a mean parameter and a standard deviation parameter, wherein the mean parameter and the standard deviation parameter for a first Gaussian model of the first set of Gaussian models is different from the mean parameter and the standard deviation parameter for a second Gaussian model of the first set of Gaussian models;
    determining, based on the first set of Gaussian models, the mean parameter and the standard deviation parameter for each of the plurality of PV states;
    determining, based on the mean parameter and the standard deviation parameter for each of the plurality of PV states, a plurality of updated read voltages; and
    applying the plurality of updated read voltages to the memory device to retrieve information from the memory device.

2. The method of claim 1, further comprising:
    obtaining a second plurality of cell counts for each of a subset of the plurality of read voltages applied to the memory device, the subset of the plurality of read voltages corresponding to PV states comprising at least two of the LSB, the MSB, and the CSB; and
    generating, based on the second plurality of cell counts, a second set of Gaussian models for the plurality of PV states,
    wherein the mean parameter and the standard deviation parameter for each of the plurality of PV states is further based on the second set of Gaussian models.

3. The method of claim 1, wherein the first plurality of cell counts and a second plurality of counts are obtained from a same word line (WL).

4. The method of claim 1, wherein determining the mean parameter and the standard deviation parameter for each of the plurality of PV states comprises inverting a Q-function.

5. The method of claim 4, wherein the Q-function of an argument (x) is defined as:

$$Q(x) = \frac{1}{\sqrt{2\pi}} \int_x^\infty \exp\left(-\frac{u^2}{2}\right) du.$$

6. The method of claim 4, wherein inverting the Q-function is based on a look-up table.

7. The method of claim 4, wherein determining the mean parameter and the standard deviation parameter for each of the plurality of PV states further comprises solving a set of linear equations.

8. The method of claim 1, wherein determining an updated read voltage of the plurality of updated read voltages for adjacent PV states is based on an absolute value of a difference between the standard deviations for the adjacent PV states.

9. A system for improving performance of a memory device, comprising:
    a processor and a memory including instructions stored thereupon, wherein the instructions upon execution by the processor cause the processor to:
        obtain a first plurality of cell counts for each of a plurality of read voltages applied to the memory device, wherein each of the plurality of read voltages corresponds to a program verify (PV) state, wherein a representation of the PV state comprises a least significant bit (LSB), a most significant bit (MSB), and a central significant bit (CSB), and wherein each of the first plurality of cell counts represents a number of cells having a cell voltage value that is within a voltage band corresponding to the read voltage for the associated PV state applied thereto;
        generate, based on the first plurality of cell counts, a first set of Gaussian models for a plurality of PV states corresponding to the plurality of read voltages, each of the first set of Gaussian models comprising a mean parameter and a standard deviation parameter, wherein the mean parameter and the standard deviation parameter for a first Gaussian model of the first set of Gaussian models is different from the mean parameter and the standard deviation parameter for a second Gaussian model of the first set of Gaussian models;

determine, based on the first set of Gaussian models, the mean parameter and the standard deviation parameter for each of the plurality of PV states;

determine, based on the mean parameter and the standard deviation parameter for each of the plurality of PV states, a plurality of updated read voltages; and apply the plurality of updated read voltages to the memory device to retrieve information from the memory device.

10. The system of claim 9, wherein the instructions upon execution by the processor further cause the processor to:

obtain a second plurality of cell counts for each of a subset of the plurality of read voltages applied to the memory device, the subset of the plurality of read voltages corresponding to PV states comprising at least two of the LSB, the MSB, and the CSB; and generate, based on the second plurality of cell counts, a second set of Gaussian models for the plurality of PV states, wherein the mean parameter and the standard deviation parameter for each of the plurality of PV states is further based on the second set of Gaussian models.

11. The system of claim 9, wherein the first plurality of cell counts and a second plurality of counts are obtained from a same word line (WL).

12. The system of claim 9, wherein determining the mean parameter and the standard deviation parameter for each of the plurality of PV states comprises inverting a Q-function.

13. The system of claim 12, wherein the Q-function of an argument (x) is defined as:

$$Q(x) = \frac{1}{\sqrt{2\pi}} \int_x^\infty \exp\left(-\frac{u^2}{2}\right) du,$$

and wherein inverting the Q-function is based on a look-up table.

14. The system of claim 12, wherein determining the mean parameter and the standard deviation parameter for each of the plurality of PV states further comprises solving a set of linear equations.

15. The system of claim 9, wherein the memory device comprises a non-volatile memory comprising at least one quadruple level cell (QLC).

16. A non-transitory computer-readable storage medium having instructions stored thereupon for improving performance of a memory device, comprising:

instructions for obtaining a first plurality of cell counts for each of a plurality of read voltages applied to the memory device, wherein each of the plurality of read voltages corresponds to a program verify (PV) state, wherein a representation of the PV state comprises a least significant bit (LSB), a most significant bit (MSB), and a central significant bit (CSB), and wherein each of the first plurality of cell counts represents a number of cells having a cell voltage value that is within a voltage band corresponding to the read voltage for the associated PV state applied thereto;

instructions for generating, based on the first plurality of cell counts, a first set of Gaussian models for a plurality of PV states corresponding to the plurality of read voltages, each of the first set of Gaussian models comprising a mean parameter and a standard deviation parameter, wherein the mean parameter and the standard deviation parameter for a first Gaussian model of the first set of Gaussian models is different from the mean parameter and the standard deviation parameter for a second Gaussian model of the first set of Gaussian models;

instructions for determining, based on the first set of Gaussian models, the mean parameter and the standard deviation parameter for each of the plurality of PV states;

instructions for determining, based on the mean parameter and the standard deviation parameter for each of the plurality of PV states, a plurality of updated read voltages; and instructions for applying the plurality of updated read voltages to the memory device to retrieve information from the memory device.

17. The storage medium of claim 16, further comprising:

instructions for obtaining a second plurality of cell counts for each of a subset of the plurality of read voltages applied to the memory device, the subset of the plurality of read voltages corresponding to PV states comprising at least two of the LSB, the MSB, and the CSB; and instructions for generating, based on the second plurality of cell counts, a second set of Gaussian models for the plurality of PV states, wherein the mean parameter and the standard deviation parameter for each of the plurality of PV states is further based on the second set of Gaussian models.

18. The storage medium of claim 16, wherein determining the mean parameter and the standard deviation parameter for each of the plurality of PV states comprises inverting a Q-function.

19. The storage medium of claim 18, wherein the Q-function of an argument (x) is defined as:

$$Q(x) = \frac{1}{\sqrt{2\pi}} \int_x^\infty \exp\left(-\frac{u^2}{2}\right) du,$$

and wherein inverting the Q-function is based on a look-up table.

20. The storage medium of claim 18, wherein determining the mean parameter and the standard deviation parameter for each of the plurality of PV states further comprises solving a set of linear equations.

* * * * *